(12) United States Patent
Shin et al.

(10) Patent No.: US 6,624,464 B2
(45) Date of Patent: Sep. 23, 2003

(54) HIGHLY INTEGRATED NON-VOLATILE MEMORY CELL ARRAY HAVING A HIGH PROGRAM SPEED

(75) Inventors: Kwang-Shik Shin, Seoul (KR); Kyu-Charn Park, Kyungki-do (KR); Sung-Nam Chang, Kyungki-do (KR); Jung-Dal Choi, Kyungki-do (KR); Won-Hong Lee, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/001,460

(22) Filed: Oct. 29, 2001

(65) Prior Publication Data

US 2002/0080659 A1 Jun. 27, 2002

(30) Foreign Application Priority Data

Nov. 14, 2000 (KR) .......................... 2000-67468

(51) Int. Cl.$^7$ .............................................. H01L 29/76
(52) U.S. Cl. ................... 257/314; 257/315; 257/316; 438/201; 438/211; 438/257
(58) Field of Search .............. 257/314–323, 257/239, 261; 438/257–264, 201, 211, 266, 594

(56) References Cited

U.S. PATENT DOCUMENTS

| 4,874,715 | A | * | 10/1989 | Paterson ..................... 438/259 |
| 5,138,573 | A | | 8/1992 | Jeuch |
| 5,973,353 | A | * | 10/1999 | Yang et al. |
| 6,222,225 | B1 | * | 4/2001 | Nakamura et al. |
| 6,403,421 | B1 | * | 6/2002 | Ikeda et al. ................. 439/267 |

FOREIGN PATENT DOCUMENTS

JP          11-054633          2/1999

OTHER PUBLICATIONS

English language of Japanese Patent No. 11–54633.

* cited by examiner

Primary Examiner—David Nelms
Assistant Examiner—Long Tran
(74) Attorney, Agent, or Firm—Marger Johnson & McCollom, P.C.

(57) ABSTRACT

A non-volatile memory cell array having second floating gates with a narrow width, a large height, and slanted side walls. Critical dimension errors due to photolithographic and etching processes are decreased. The difference in the coupling ratio between the memory cells is low thereby improving speed during programming and/or erasing. A second floating gate having a narrower critical dimension than a second floating gate obtained using a photolithographic process may be designed, thereby forming a highly integrated non-volatile memory cell array.

8 Claims, 5 Drawing Sheets

HIGHLY INTEGRATED NON-VOLATILE MEMORY CELL ARRAY HAVING A HIGH PROGRAM SPEED

This application claims priority from the Korean Patent Application No. 00-67468, filed Nov. 14, 2000, the contents of which are herein incorporated by reference in their entirety.

FIELD OF THE INVENTION

The present invention relates to an integrated non-volatile memory cell array and, more particularly, to a highly integrated non-volatile memory cell array having a high program speed.

BACKGROUND OF THE INVENTION

Semiconductor devices are largely classified into random access memories (RAMs), such as dynamic random access memories (DRAMs) and static random access memories (SRAMs), and read only memories (ROMs). RAMs input and output data at a high speed but lose data when power is turned off. ROMs on the other hand, input and output data at a low speed but maintain the data even when power is turned off. Electrically erasable and programmable ROMs (EEPROM) are a type of ROM capable of electrically erasing data. Flash memory is a developed form of the EEPROM, that can also be electrically erased. Flash memory uses so-called Fowler-Nordheim tunneling or hot electron technology to control the input and output of data.

FIGS. 1A and 1B are a perspective view and a cross-sectional view, respectively, of a non-volatile memory cell structure of a common flash memory device. Referring to FIGS. 1A and 1B, the non-volatile memory cell has a stack type gate structure. Field oxide layers 110 are spaced apart from each other on a semiconductor substrate 100. A tunnel oxide layer 120, floating gates 130 and 140, a dielectric layer 150, and a control gate 180 are sequentially formed over an electrically active region (not shown) between the field oxide layers 110. A first floating gate 130 is restricted to an electrically active region so that a critical dimension thereof is equal to a critical dimension of the electrically active region. A second floating gate 140 extends to the field oxide layers 110 so that a critical dimension thereof is larger than that of the first floating gate 130.

As shown in FIGS. 1A and 1B, the floating gates 130 and 140 have a two-electrode-structure to increase a coupling ratio. The coupling ratio, which denotes a ratio of voltage applied to a control gate and voltage coupled to a floating gate, is a key parameter in storing and erasing data in the flash memory. The programming coupling ratio ($C/R_p$) is indicated as Equation 1.

$$C/R_p = \frac{C_{ono}}{C_{ono} + C_{tun}} \quad \text{Equation 1}$$

wherein:

$C_{ono}$ indicates capacitance of a dielectric layer; and
$C_{tun}$ indicates capacitance of a tunnel oxide layer.

The erasing coupling ratio ($C/R_e$) is indicated as Equation 2.

$$C/R_e = \frac{C_{tun}}{C_{ono} + C_{tun}} \quad \text{Equation 2}$$

The programming coupling ratio calculated by Equation 1 is generally kept between 0.55–0.65. The erasing coupling ratio is approximately 0.35–0.45. To increase the programming coupling ratio, it is necessary to increase the capacitance ($C_{ono}$) of the dielectric layer 150. A stack layer of oxide/nitride/oxide having a larger dielectric constant than the tunnel oxide layer 120 is used as the dielectric layer 150. Another method of increasing the coupling ratio is to increase a contact area of the dielectric layer 150 and the second floating gate 140.

Meanwhile, capacitance of the dielectric layer 150 is proportional to the contact area of the second floating gate 140 and the dielectric layer 150. It is important, therefore, to keep the contact area of the second floating gate 140 uniform in the memory cell array. If the capacitance in the cell is changed, the coupling ratio also changes every cell when data is stored and erased. Consequently, each cell does not consistently operate at a predetermined voltage. To prevent malfunction during programming or erasing, the cell is programmed more frequently resulting in increased programming time thereby lowering device performance.

Referring to a conventional flash memory cell shown in FIG. 1B, a width W of the second floating gate 140 overlaps field oxide layers 110 to widen the contact area of the floating gate 140 and the dielectric layer 150 so that a height H is smaller than the width W. In such a structure, the upper area of the second floating gate 140 contacts the dielectric layer 150. Consequently, the width W of the second floating gate 140 of the conventional flash memory cell is sensitive to critical dimension error due to parameters in photolithographic and etching processes for patterning the second floating gate 140.

Generally, in photolithographic and etching processes there are a lot of parameters causing critical dimension error, for example, a proximity effect generated in the manufacturing of the mask of the photolithographic process and a loading effect generated in the etching process. It is difficult to control these parameters due to design rule reduction and pattern density increases in semiconductor circuits.

SUMMARY OF THE INVENTION

It is an object of the present invention to overcome the disadvantages associated with prior art non-volatile memory cells.

It is another object of the present invention to provide a non-volatile memory cell array having a high program speed owing to low coupling ratio variability between memory cells.

Accordingly, to achieve the above object, there is provided a non-volatile memory cell array comprising protruding field oxide layers arranged on a substrate at predetermined intervals. Electrically active regions are separated from each other by the protruding field oxide layers. A plurality of field oxide layers and a first floating gate is sequentially stacked, the field oxide layers and the first floating gate being restricted on the respective electrically active regions. A plurality of second floating gates is electrically connected to the respective first floating gates, the second floating gates having a width which extends to the adjacent field oxide layers on either side. Slanted side walls cause the width to narrow towards an upper surface and a height from the field oxide layers is larger than the width of the upper surface. A dielectric layer is formed on the plurality of second floating gates. A continuous control gate is formed on the dielectric layer.

According to an embodiment of the present invention, a distance between the upper surfaces of two adjacent second floating gates is 1.4–1.8 times a distance between the adjacent second floating gates on the gate oxide layer. The distance between the upper surfaces of two adjacent second floating gates is equal to the width of the first floating gates. The width of the upper surfaces of the second floating gates is larger than or equal to the width of the first floating gates.

According to an embodiment of the present invention, the ratio of the height of the upper surfaces of the second floating gates from the field oxide layers into the width of the upper surfaces of the second floating gates is 1–3. In one embodiment, the height of the upper surface of the second floating gate from the field oxide layer is approximately 2000–4000 Å.

According to an embodiment of the present invention, the side walls of the plurality of the second floating gates are slanted at 60–80°.

In a non-volatile memory cell array of the present invention, the width of the second floating gate is narrow and the height thereof is large. Consequently, the difference in the coupling ratio between the memory cells is low, thereby improving program speed in programming or erasing. And the side walls of the second floating gate of the present invention are slanted, thereby forming a highly integrated non-volatile memory cell array.

BRIEF DESCRIPTION OF THE DRAWINGS

The above objective and advantages of the present invention will become more apparent by describing in detail a preferred embodiment with reference to the attached drawings.

DESCRIPTION OF THE PREFERRED EMBODIMENTS

Figure 1A:
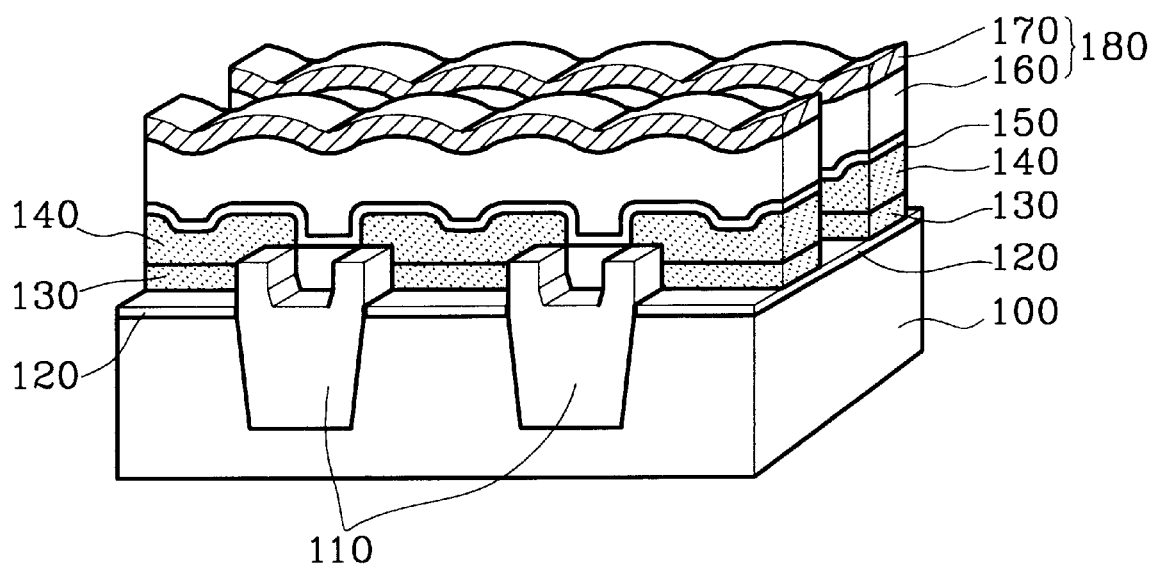
FIGS. 1A and 1B are perspective and cross-sectional views, respectively, of a conventional non-volatile memory cell structure.
Figure 1B:
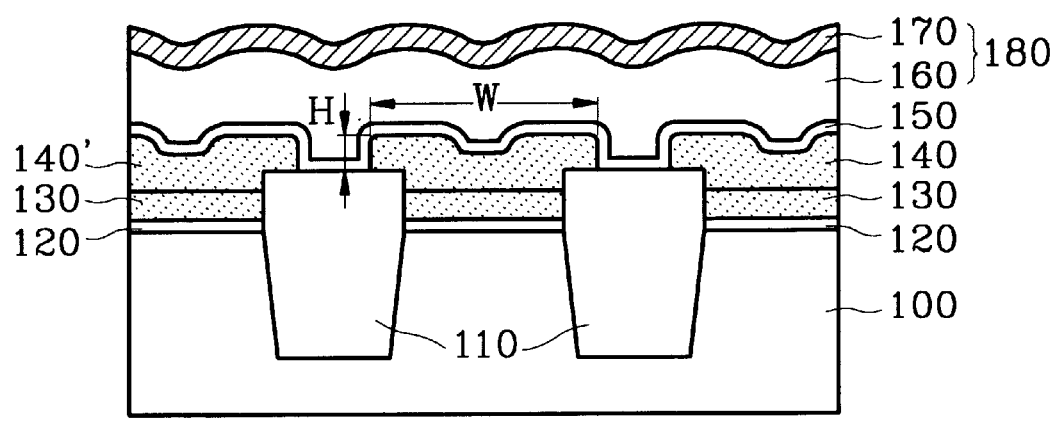

An embodiment of the present invention will be described in detail with reference to the attached drawings. The described embodiment of the present invention can be modified into various other forms and the scope of the present invention must not be interpreted as being restricted to the described embodiment. The embodiment described herein is provided to more completely explain the present invention to those skilled in the art. Like reference numerals in the drawings denote like members.

Figure 2:
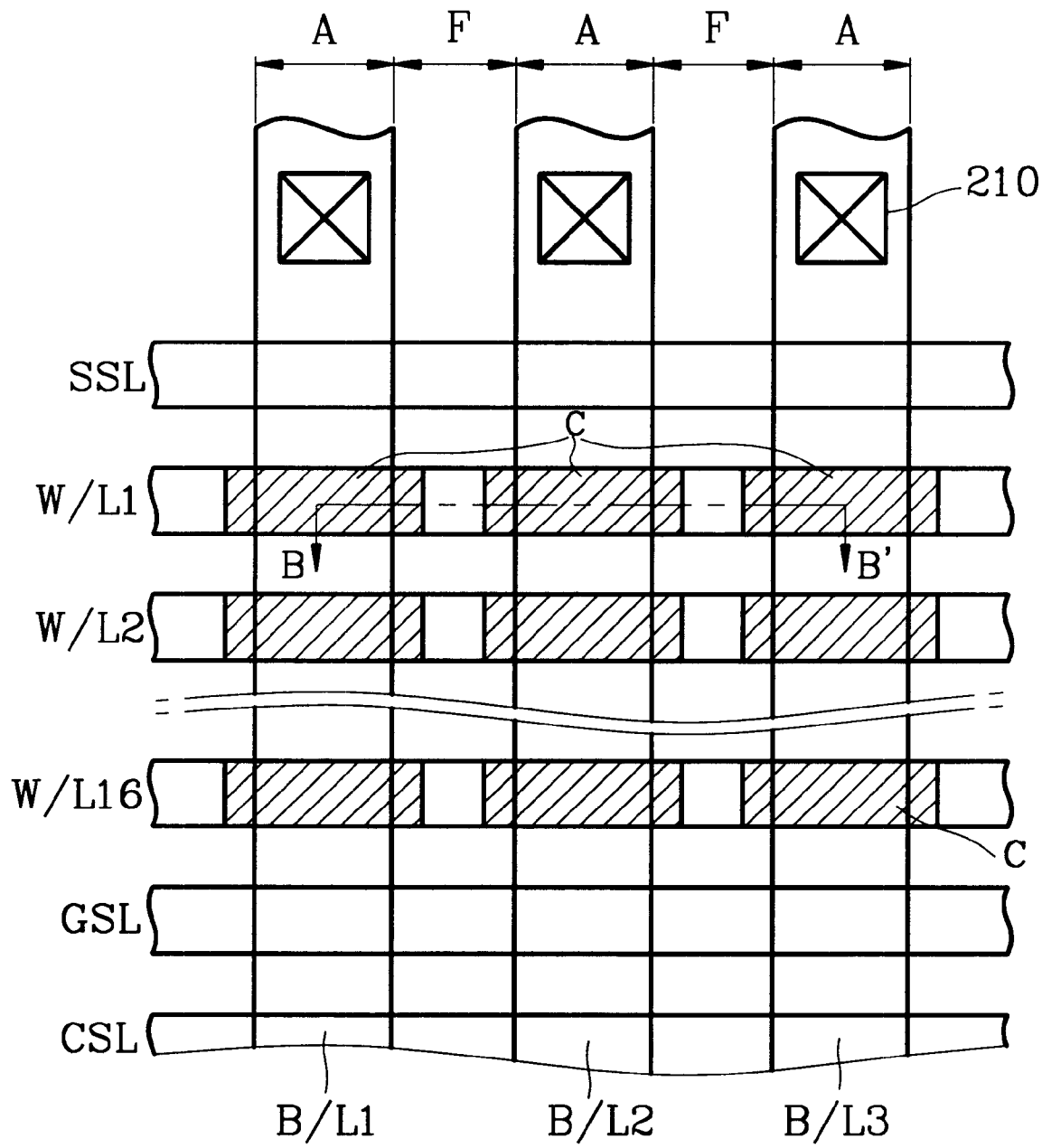
FIG. 2 is a plan layout of a NAND flash memory device including a non-volatile memory cell of the present invention.

FIG. 2 is a plan layout of a NAND flash memory device having a non-volatile memory cell of the present invention. Referring to FIG. 2, a string select line SSL, and a ground select line GSL are received at gates of a string and a ground select transistor, respectively. Layers F are field oxide layers. Layers A are electrically active regions. A plurality of transistors C is formed on active regions in which word lines W/L1, W/L2 . . . W/L16 are connected to corresponding gates. The transistors C and the string and ground select transistors are connected in series to form one string. A plurality of strings are parallel connected to bit lines B/L1, B/L2, . . . and form one block. The string and ground select transistors are common MOS transistors not requiring a floating gate. A drain of the string select transistor is connected through a bit line contact hole 210 to a bit line, and a source of the ground select transistor is connected to a common source line CSL.

Figure 3:
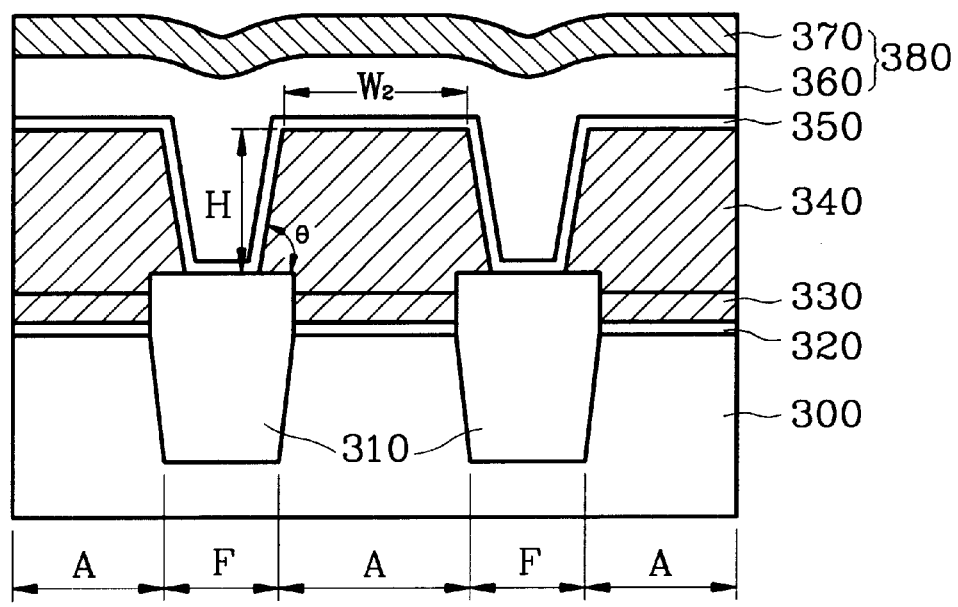
FIG. 3 is a cross-sectional view of the memory cell array shown in FIG. 2 cut along a word line (line a B–B')

FIG. 3 is a cross-sectional view of the non-volatile memory cell array of the present invention along the line B–B' of FIG. 2. A memory cell of the present invention comprises a tunnel oxide layer 320 formed on active regions A of a semiconductor substrate 300, first floating gates 330, second floating gates 340, a dielectric layer 350, and a control gate 380.

Field oxide layer regions F and active regions A are arranged parallel to bit lines and alternated across the surface of the semiconductor substrate 300. Field oxide layers 310 have a shallow trench structure and protrude from the trench above the surface of the semiconductor substrate 300, having a predetermined height. The tunnel oxide layer 320 and the first floating gates 330 for F–N tunneling are sequentially stacked on active regions A bounded by the protruding field oxide layers 310. The tunnel oxide layer 320 is formed of a silicon oxide layer or an oxynitride layer and the thickness thereof is approximately 70–100 Å. The first floating gates 330 are mainly formed of a polysilicon layer doped in-situ and the thickness thereof is approximately 300–1000 Å. The width of the first floating gates 330 may vary widely, generally designed to be the minimum width at which a photolithographic process may still be performed in order to increase integration density.

The second floating gates 340 are formed on the first floating gates 330 and over the edges of the field oxide layers 310 where they are separated from one another. The side walls of the second floating gates 340 are slanted so that the width thereof becomes narrower toward the top thereof. The height H of the second floating gates above the surface of the field oxide layers 310 is larger than the width $W_2$ on the upper surface of the second floating gates 340.

The dielectric layer 350 is interposed between the second floating gates 340 and the control gate 380. The dielectric layer 350 keeps electric charge on the first and second floating gates 330 and 340 and transmits voltage of the control gate 380 to the first and second floating gates 330 and 340, respectively.

The control gate 380 is formed as a continuous vertical layer with a bit line on the dielectric layer 350. The control gate 380 forms word lines. It is preferable that the control gate 380 is made of a polysilicon layer 360 and a silicide layer 370 stacked on the polysilicon layer 360.

It is generally considered much easier to uniformly control the thickness of a layer than to uniformly control the width of a pattern. In the memory cell of the present invention, the height of the second floating gates 340 is greater than the width thereof as compared with the conventional floating gate. Accordingly, the contact area between the side walls of the second floating gates 340 and the dielectric layer is larger. The memory cell is, thus, affected little by critical dimension errors in the photolithographic and etching processes. Consequently, the floating gate structure of the present invention has higher program speed than common cell described earlier because the difference in coupling ratio between respective memory cells is reduced. Where the width of the second floating gates 340 of the memory cell array is maintained uniformly and the height is changed; for example, increased from 2000 to 2500 Å, program voltage is lowered by 0.5V, correspondingly increasing the program speed.

Moreover, since the side walls of the second floating gates 340 of the present invention are slanted, the area of the side walls along the dielectric layer 350 further increases. The slope of the side wall (θ) is preferably 60°–80° considering an etching process and a width, which will be described later.

The Height H of the second floating gate 340 is greater than the width W on the upper surface thereof. Where the width on the upper surface is 1400 Å, the height thereof is preferably 2000–4000 Å. The ratio of the height to the width is in the range of 1–3.

Figure 4:
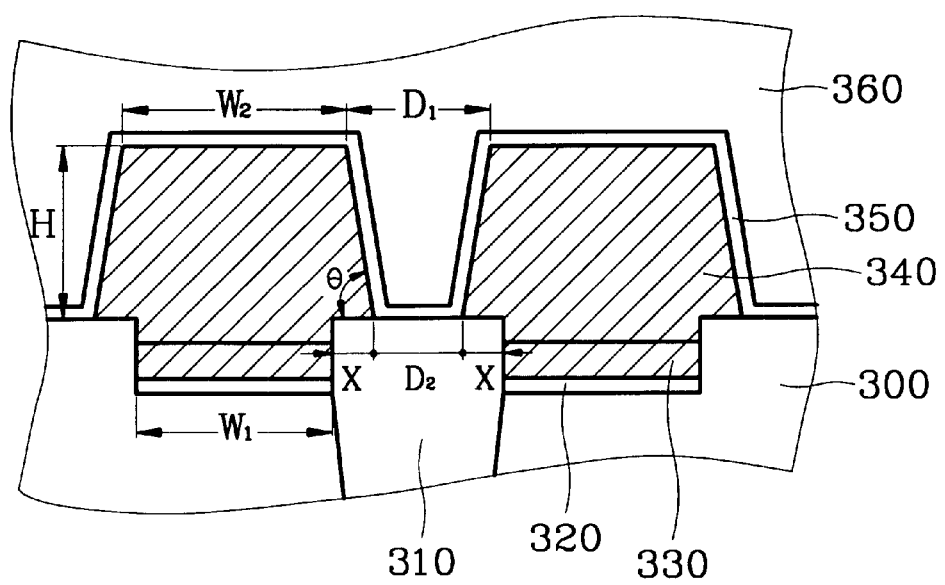
FIG. 4 is a magnified cross-sectional view of a part of a non-volatile memory cell array structure of the present invention.

The arrangement of the floating gates, in which distance and width of each memory cell are properly adjusted, will be described with reference to FIG. 4. FIG. 4 is a magnified view of a part of the non-volatile memory cell array structure of FIG. 3 centering around the second floating gate 340. The width $W_1$ of the first floating gate 330 is equal to the upper separation distance $D_1$ of the second floating gate 340 and is a minimum width at which a photolithographic process might be performed. Also, the upper width $W_2$ of the second floating gate 340 might be equal to or larger than $W_1$ and $D_1$.

The distance $D_2$ between adjacent floating gates 340 laid on the field oxide layers 310 is narrower than the minimum width at which a photolithographic process may still be performed, since the side walls of the floating gate 340 are slanted. As the upper width $W_2$ of the second floating gate 340 becomes narrow, the integration density of the memory cell of the present invention increases. Where the upper width $W_2$ is equal to the minimum width at which a photolithographic process might still be performed, the memory cell of the present invention has a maximum integration density.

Where the upper width $W_2$ of the second floating gate 340 is equal to the minimum width at which a photolithographic process might still be performed, the distance $D_2$ between the second floating gates 340 on the field oxide layers 310 is $D_2=D_1-2X$. For example, where $D_1$ is 0.14 μm and X is 0.03 μm, $D_2$ is 0.08 μm and 0.57 times a value $D_1$. As mentioned above, the distance $D_2$ between the floating gates on the field oxide layers 310 may be much narrower than the minimum width corresponding to the resolution of a photolithographic process. The size of the part of the second floating gate 340 formed on the field oxide layers 310 may be different depending on the slope of the side walls. However, $D_2/D_1$ is preferably in the range of 0.4–0.8.

Figure 5A:
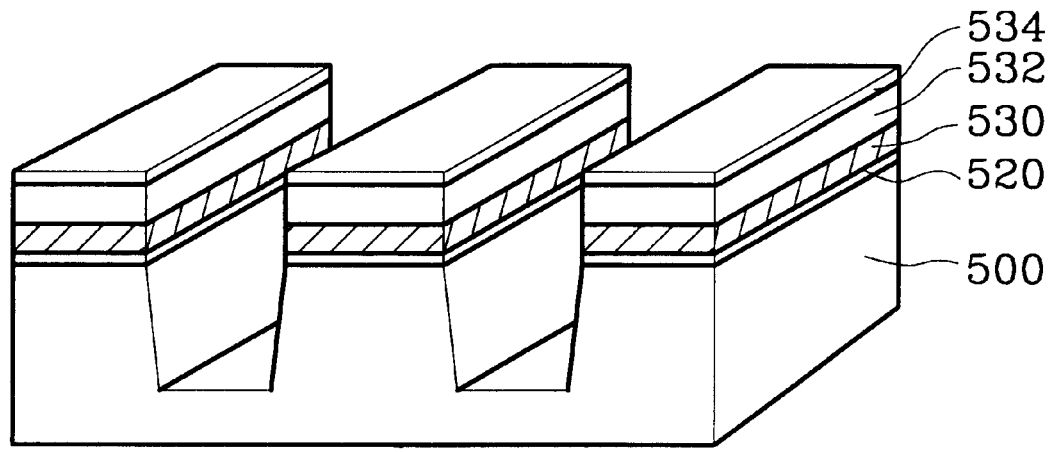
FIGS. 5A through 5D are perspective views illustrating the process of forming a non-volatile memory cell array having a floating gate of the present invention.
Figure 5B:
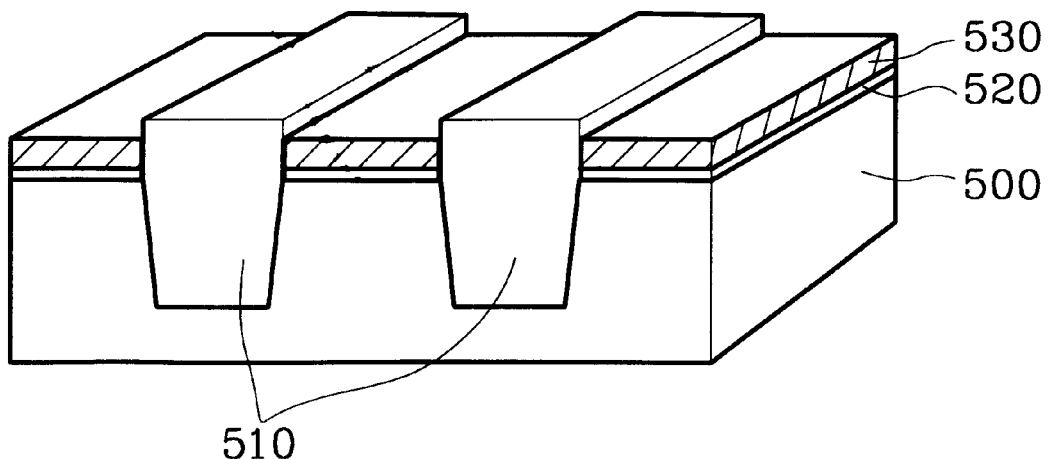

A method of forming a memory cell array of the present invention as described above with reference to FIGS. 2 through 4 will be briefly described with reference to FIGS. 5A through 5D. FIGS. 5A and 5B illustrate a process of forming first floating gates and associated field oxide layers over a semiconductor substrate 500 using a shallow trench isolation method. First, referring to FIG. 5A, a silicon oxide layer 520, a polysilicon layer or first floating gate 530, a silicon nitride layer 532, and a high temperature oxide layer 534 are sequentially formed over the semiconductor substrate 500. Next, a hard mask pattern defining an electrically active region is formed by opening the high temperature oxide layer 534 by common photolithographic and dry etching processes. Trenches are formed by etching the silicon nitride layer 532, the polysilicon layer 530, the silicon oxide layer 520 and the semiconductor substrate 500 to a predetermined depth using the hard mask pattern as an etching mask. The polysilicon nitride layer 532 serves as an etching stopper in a subsequent chemical mechanical polishing process.

Field oxide layers 510 fill the trenches shown in FIG. 5B. More particularly, the high temperature oxide layer 534 is eliminated and the inside of the trenches and the upper part of the silicon nitride layer 532 are covered with an isolation oxide layer, for example, a USG layer. Next, the USG layer is eliminated by chemical mechanical polishing using the silicon nitride layer 532 as the etching stopper and then the silicon nitride layer 532 is eliminated by phosphoric acid strip.

Figure 5C:
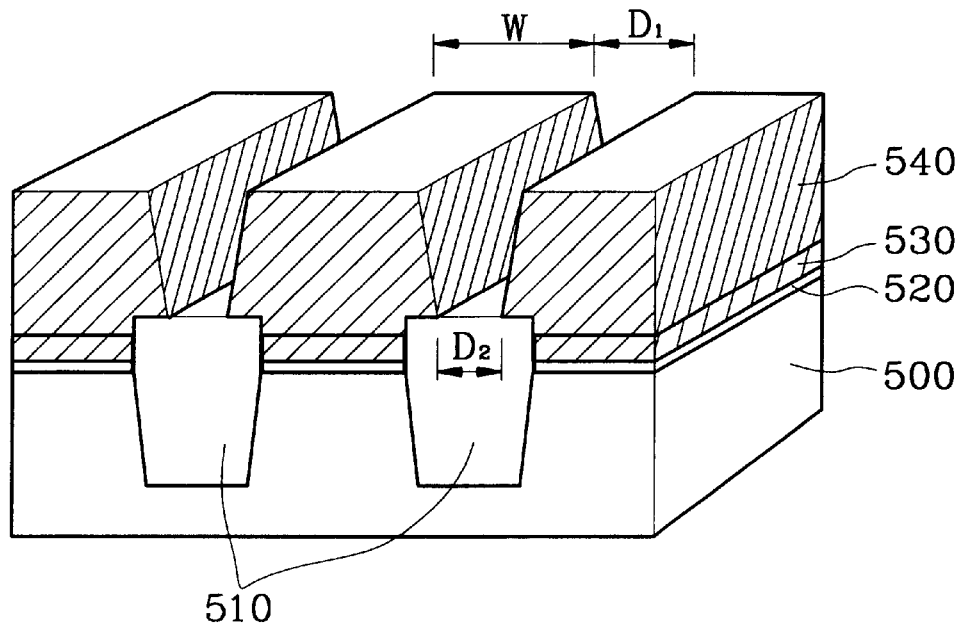

FIG. 5C shows a process of forming second floating gate 540. A polysilicon layer is deposited on the field oxide layers 510 and the first floating gates 530 to a predetermined thickness. A photoresist pattern having an opening of a predetermined critical dimension (not shown) is formed by applying a common photolithographic process to the polysilicon layer. Next, the second floating gate 540, whose side wall is slanted, is formed by etching the polysilicon layer by an isotropic dry etching method or a slanted etching method, using the photoresist pattern as an etching mask. The polysilicon layer is required to be deposited higher than the upper surface width W of the second floating gate 540. The etching method is used to narrow the distance $D_2$ over the field oxide layer 510 rather than the minimum critical dimension which may be formed by the photolithographic process, namely, the upper surface distance $D_1$ between the adjacent second floating gates. As a result, the average distance between the second floating gates 540 becomes close thereby increasing the integration density of the memory cell.

An isotropic dry etching method is used to decrease an isotropic etching property by shortening a mean free path of plasma ions and weakening the straight forwardness of ion or by a reactive ion etching process using reactive gas such as $SF_6$. The slanted etching method is used to form an etching face having the slope at the side face where a non-volatile polymer created as a by-product of etching is deposited on the side of the face upon which ions are incident and is not etched.

Figure 5D:
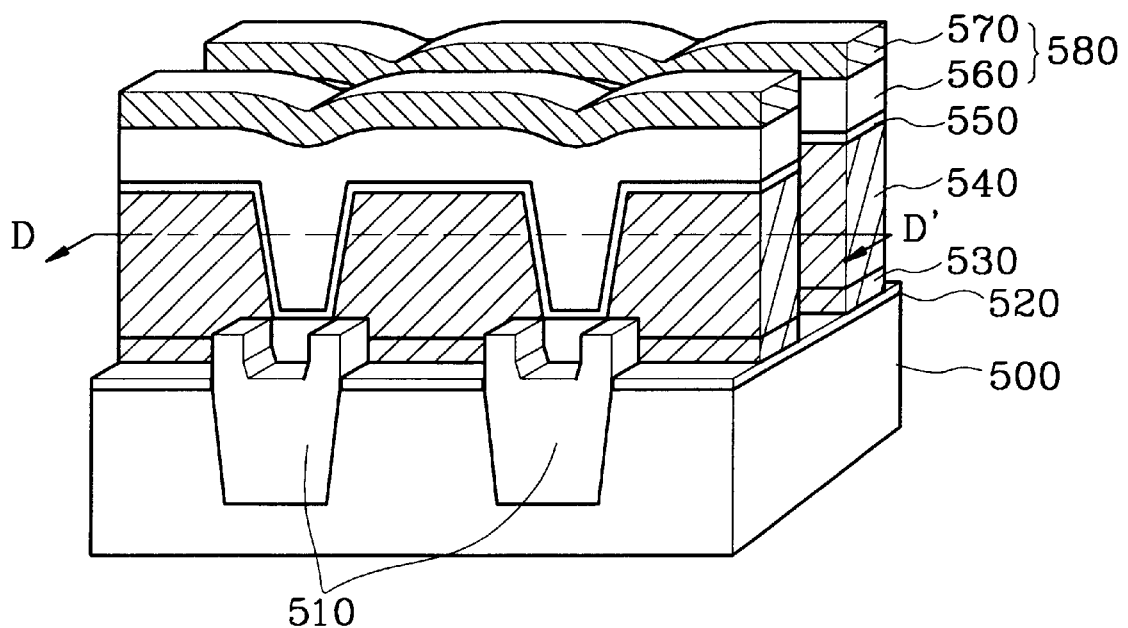

FIG. 5D shows a process of forming a dielectric layer 550 and a control gate 580 on the second floating gate 540. A common silicon oxide layer may be used as the dielectric layer 550 or a stack layer of oxide/nitride/oxide may be used to increase the dielectric constant. The stack layer may be formed in several ways. For example, the oxide layer may be formed by a thermal oxidation method or a low-pressure chemical vapor deposition (LPCVD) method, and the nitride layer may be formed by a low-pressure chemical vapor deposition (LPCVD) method. The thickness of the deposited stack layer may be adjusted depending on coupling ratio. The control gate 580 is a double control gate formed of polysilicon/silicide. Next, a non-volatile memory cell array arranged in a word line direction is obtained by sequentially etching the control gate 580, the dielectric layer 550, the second floating gate 540 and the first floating gate 530. The cross-section along the line D–D', in the direction indicated, of the memory cell array in FIG. 5D is identical to the cross-section shown in FIG. 3.

In the memory cell array of the present invention, the width of the second floating gate is narrower than in the conventional memory cell arrays and the height thereof is greater. Therefore, critical dimension error due to parameters of the photolithographic and etching processes in forming the pattern can be decreased. Consequently, the difference in the coupling ratio between the respective memory cells is low, thereby increasing program speed in programming or erasing. And, since the side walls of the second floating gate of the present invention are slanted, the second floating gate may be made narrower than side walls of a second floating gate obtained using photolithographic processes. Consequently, a highly integrated non-volatile memory cell array can be formed.

What is claimed is:

1. A non-volatile memory cell array, comprising:

a plurality of electrically active regions;

a plurality of field oxide layers;

a first floating gate sequentially stacked on a tunnel oxide layer, the first floating gate and the tunnel oxide layer being formed on the electrically active regions defined by adjacent field oxide layers;

a second floating gate sequentially stacked on and electrically connected to the first floating gate, the second floating gate having a substantially trapezoidal shape with a width that extends to adjacent field oxide layers, slanted straight side walls that are narrower at a substantially horizontal upper surface, and a height from the plurality of field oxide layers to the upper surface that is larger than the width and smaller than a height from the tunnel oxide layer to the upper surface;

a dielectric layer formed on the second floating gate; and a continuous control gate formed on the dielectric layer;

where a slope tangential to the sidewalls of the second floating gate does not vary with location.

2. The non-volatile memory cell array of claim 1 wherein a distance between upper surfaces of adjacent second floating gates is between 1.4 and 1.8 times a distance between gate oxide layers of the adjacent second floating gates.

3. The non-volatile memory cell array of claim 1:

wherein a distance between upper surfaces of adjacent second floating gates is equal to a width of a first floating gate; and wherein the width on the upper surface of the second floating gate is larger than or equal to the width of the first floating gate.

4. The non-volatile memory cell array of claim 1 wherein a slope of the slanted sidewalls is between 60 and 80 degrees.

5. The non-volatile memory cell array of claim 1 wherein a ratio of the height to width of the second floating gate is between 1 and 3.

6. The non-volatile memory cell array of claim 5 wherein the height is about 2000–4000 Å.

7. The non-volatile memory cell array of claim 1 wherein the dielectric layer comprises an oxide layer stacked on a nitride layer stacked on an oxide layer.

8. The non-volatile memory cell array of claim 1 wherein the continuous control gate comprises a silicide layer stacked on the polysilicon layer.

* * * * *